(12) United States Patent
Arakawa

(10) Patent No.: US 7,979,627 B2
(45) Date of Patent: Jul. 12, 2011

(54) STORAGE DEVICE WITH BINARY AND MULTIVALUED MEMORY

(75) Inventor: Tadashi Arakawa, Nagoya (JP)

(73) Assignee: Buffalo Inc., Nagoya (JP)

( * ) Notice: Subject to any disclaimer, the term of this patent is extended or adjusted under 35 U.S.C. 154(b) by 510 days.

(21) Appl. No.: 12/120,108

(22) Filed: May 13, 2008

(65) Prior Publication Data

US 2008/0288716 A1    Nov. 20, 2008

(30) Foreign Application Priority Data

May 14, 2007  (JP) ................................ 2007-127665
Jan. 11, 2008  (JP) ................................ 2008-004691

(51) Int. Cl.
  *G06F 13/00*  (2006.01)
(52) U.S. Cl. ................................ 711/103; 711/E12.008
(58) Field of Classification Search ........................ None
   See application file for complete search history.

(56) References Cited

U.S. PATENT DOCUMENTS

2008/0086588 A1 *   4/2008  Danilak et al. ................ 711/103

FOREIGN PATENT DOCUMENTS

| JP | 10-260908 | 9/1998 |
| JP | 11-31102 | 2/1999 |
| JP | 2000-173281 | 6/2000 |
| JP | 2001-306393 | 11/2001 |
| JP | 2002-8380 | 1/2002 |
| JP | 2006-048746 A | 2/2006 |
| WO | WO 2006/088727 | 8/2006 |
| WO | WO 2007/037757 | 4/2007 |

OTHER PUBLICATIONS

Machine translation of Sukegawa Hiroshi (JPN: 11-031102).*
Machine translation of Fukuzumi Tomoya (JPN: 2001-306393).*
Machine translation of Masabumi et al. (JPN: 2000-173281).*
Notification of Reason for Rejection dated Jun. 22, 2010 for Japanese Patent Application No. 2008-004691.
Office Action in corresponding Japanese Application No. 2008-004691, mailed Apr. 12, 2011.

* cited by examiner

*Primary Examiner* — Hetul Patel
(74) *Attorney, Agent, or Firm* — Beyer Law Group LLP

(57) ABSTRACT

A storage device includes: a binary flash memory that has a first storage area and a capacity of storing two values per cell; a multivalued flash memory that has a second storage area and a capacity of storing at least three values per cell; and a controller configured to arrange the first storage area ahead of the second storage area, logically combine the first storage area with the second storage area to form a single combined storage area, and perform data reading and data writing from and into the combined storage area. Data management information is stored in a head of the combined storage area according to a predetermined file system. The storage device of this arrangement has the advantages of both an SLC flash memory and an MLC flash memory.

1 Claim, 8 Drawing Sheets

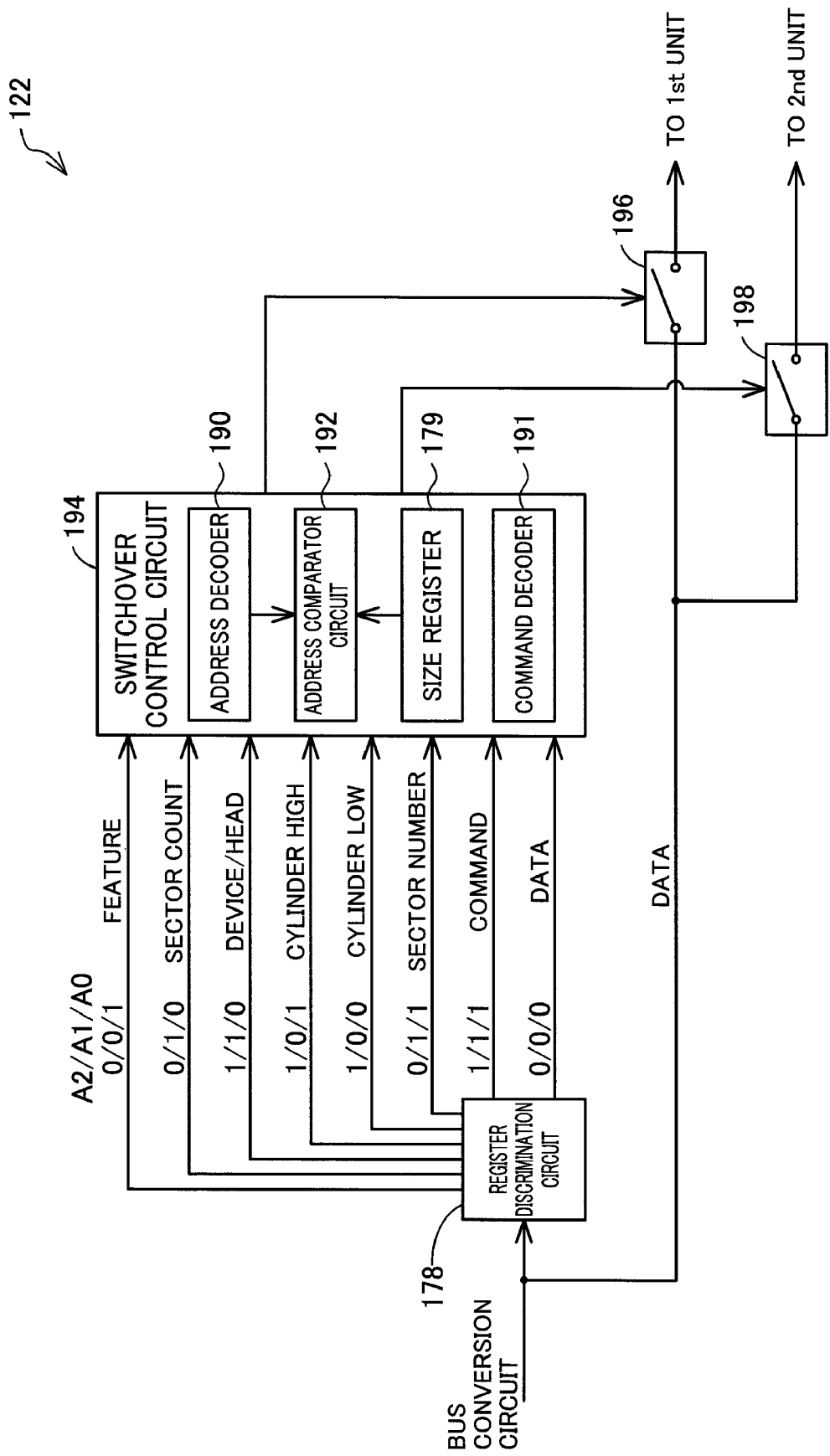

Fig.8

| REGISTERS | WRITE TIME | READ TIME |
|---|---|---|
| DATA | SWITCHOVER | SWITCHOVER (EXCEPTION 2) |
| FEATURE | SIMULTANEOUS ACCESS | SWITCHOVER |
| SECTOR COUNT | SIMULTANEOUS ACCESS | SWITCHOVER |
| SECTOR NUMBER | SIMULTANEOUS ACCESS | SWITCHOVER |
| CYLINDER LOW | SIMULTANEOUS ACCESS | SWITCHOVER |
| CYLINDER HIGH | SIMULTANEOUS ACCESS | SWITCHOVER |
| DEVICE/HEAD | SIMULTANEOUS ACCESS | SWITCHOVER |
| COMMAND | SWITCHOVER (EXCEPTION 1) | SWITCHOVER |

STORAGE DEVICE WITH BINARY AND MULTIVALUED MEMORY

CLAIM OF PRIORITY

The present application claims the priority based on Japanese Patent Applications No. 2007-127665 filed on May 14, 2007 and No. 2008-4691 filed on Jan. 11, 2008, the disclosures of which are hereby incorporated by reference in their entirety.

BACKGROUND

1. Technical Field

The present invention relates to a storage device for storing data used in computers and diversity of other electronic devices.

2. Related Art

Memory cards like compact flashes (registered trademark) and USB flash drives have widely been used as external storage devices of computers. Flash memories as rewritable nonvolatile ROMs are included in these external storage devices. There are two types of flash memories, SLC (single level cell) flash memories and MLC (multi level cell) flash memories (see, for example, JP-A-2002-8380).

The widely used SLC flash memories have the capacity of storing 1-bit information per unit cell (these flash memories are also referred to as binary memories). The MLC flash memories have the capacity of storing at least 2-bit information per unit cell (these flash memories are also referred to as multivalued memories). The MLC flash memory takes four different charging states, the fully charged state, the ⅔ charged state, the ⅓ charged state, and the fully discharged state, to store 2-bit information per unit cell.

The general features of the MLC flash memory are the larger storage capacity but the lower processing speed and the lower rewritable capability than the SLC flash memory. The general features of the SLC flash memory are the higher processing speed and the higher rewritable capability but the smaller storage capacity than the MLC flash memory.

SUMMARY

There would thus be a demand for providing a storage device having the advantages of both an SLC flash memory and an MLC flash memory.

The present invention accomplishes at least part of the demands mentioned above and the other relevant demands by the following configuration. According to one aspect, the invention pertains to a storage device constructed to store data according to a predetermined file system for recording data management information in a head of a storage area. The storage device includes: a binary flash memory that has a first storage area and a capacity of storing two values per cell; a multivalued flash memory that has a second storage area and a capacity of storing at least three values per cell; and a controller configured to arrange the first storage area ahead of the second storage area, logically combine the first storage area with the second storage area to form a single combined storage area, and perform data reading and data writing from and into the combined storage area.

In the storage device according to this aspect of the invention, the first storage area of the binary flash memory is located in the head of the combined storage area. Data management information, such as a file allocation table, is written in the binary flash memory. The file allocation table is management information frequently rewritten in response to data writing or data deleting. The arrangement of the binary flash memory having the higher processing speed than the multivalued flash memory in the head of the combined storage area enables higher-speed data storage, compared with a storage device adopting only a multivalued flash memory for the whole storage area. The binary flash memory has the higher rewritable capability than the multivalued flash memory. Writing the frequently rewritten file allocation table in the binary flash memory desirably improves the reliability of data storage. The storage device of this arrangement adopts the multivalued flash memory to satisfy the high capacity requirement, while adopting the binary flash memory to satisfy the requirements of high speed processing and high reliability.

BRIEF DESCRIPTION OF THE DRAWINGS

FIG. 7 is a block diagram schematically showing the internal structure of the unit management circuit in the second embodiment; and FIG. 8 shows the details of the switchover control performed by a switchover control circuit included in the unit management circuit.

DESCRIPTION OF THE PREFERRED EMBODIMENT

In order to clarify the functions, the advantages, and the effects of the invention, some modes of carrying out the invention are described below as preferred embodiments with reference to the accompanied drawings.

A. First Embodiment

Figure 1:
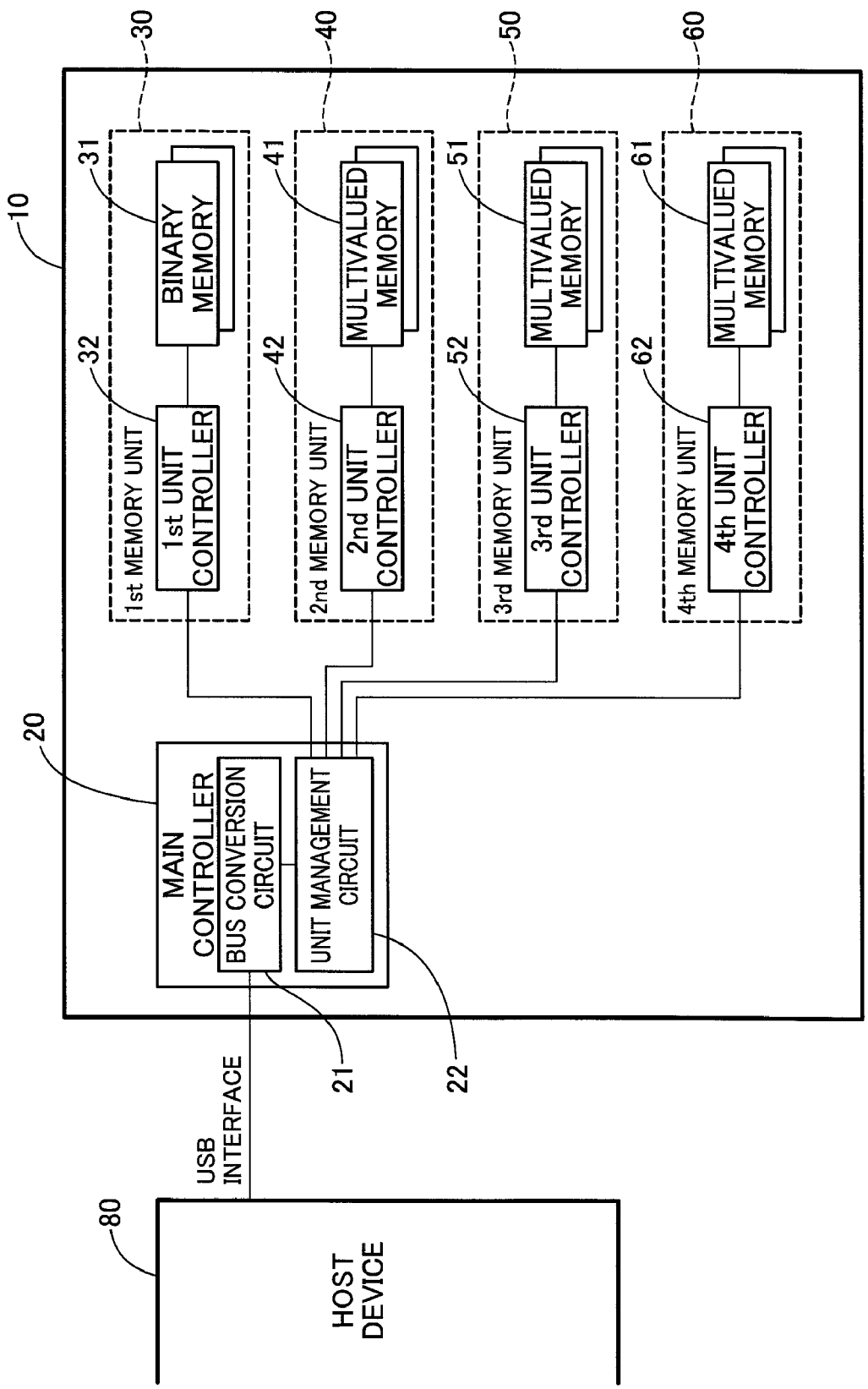
FIG. 1 schematically illustrates the configuration of a storage device in a first embodiment of the invention.

FIG. 1 schematically illustrates the configuration of a storage device 10 in a first embodiment of the invention. The storage device 10 of this embodiment is connected with a host device 80, typically a computer, via a USB interface and is used as an external storage device. The host device 80 formats the storage device 10 according to a predetermined file system (for example, FAT16 or FAT32) for data reading and writing.

As illustrated, the storage device 10 includes a main controller 20, as well as a first memory unit 30, a second memory unit 40, a third memory unit 50, a fourth memory unit 60 respectively connected with the main controller 20 and designed to have NAND flash memories.

The first memory unit 30 has a binary memory 31 that is an SLC (single level cell) type NAND flash memory. The first memory unit 30 also has a first unit controller 32 configured to control the binary memory 31 according to its electrical characteristics. In this embodiment, a general-purpose compact flash controller is adopted for the first unit controller 32. The first unit controller 32 receives commands and data in conformity with ATA (advanced technology attachment) standard from the main controller 20 and reads and writes data from and into the binary memory 31. In the structure of this embodiment, the first memory unit 30 has a storage capacity of 1 gigabyte. When one binary memory 31 does not have the storage capacity of 1 gigabyte, plural binary memories 31 may be connected to the first unit controller 32 to satisfy the storage capacity of 1 gigabyte.

The second memory unit 40 has a multivalued memory 41 that is an MLC (multi level cell) type NAND flash memory. The multivalued memory 41 of this embodiment is capable of storing information of four values (two bits). The multivalued memory 41 is, however, not restricted to this memory but may be any suitable memory capable of storing information of at least three values. The second memory unit 40 also has a second unit controller 42 configured to control the multivalued memory 41 according to its electrical characteristics. In this embodiment, a general-purpose compact flash controller is adopted for the second unit controller 42 as in the case of the first memory unit 30. The third memory unit 50 and the fourth memory unit 60 have the same configurations as that of the second memory unit 40. In the structure of this embodiment, each of the second memory unit 40, the third memory unit 50, and the fourth memory unit 60 has a storage capacity of 15 gigabytes. Namely the storage device 10 of the embodiment totally has the storage capacity of 46 gigabytes (=1 G+15 G+15 G+15 G). When one multivalued memory does not have the storage capacity of 15 gigabytes, plural multivalued memories may be connected to a corresponding unit controller to satisfy the storage capacity of 15 gigabytes.

The main controller 20 is an integrated circuit configured to control data reading and writing from and into the respective memory units 30 to 60, in response to commands from the host device 80 connected via the USB interface. The main controller 20 includes a bus conversion circuit 21 and a unit management circuit 22 as internal circuits.

The bus conversion circuit 21 functions to convert a signal in conformity with USB standard received from the host device 80 into a signal in conformity with ATA standard. The ATA standard is a standard communication interface between the computer and the storage device. Typical examples of the signal in conformity with the ATA standard include three address signals A0 to A2, sixteen data signals D0 to D15, and control signals like a reset signal.

The unit management circuit 22 functions to logically combine a storage area of the binary memory 31 with storage areas of the multivalued memories 41 to 61 included in the memory units 30 to 60 and treat the logically combined storage areas as a single storage area. The unit management circuit 22 performs address conversion based on an LBA (logical block addressing) address of the ATA signal converted by the bus conversion circuit 21 to logically combine the respective memory units 30 to 60. The LBA technique allocates serial numbers to all sectors in the storage areas and enables specification of a target sector for access by selecting its serial number. The LBA address represents this serial number. Hereafter the 'LBA address' is also referred to as 'LBA parameter'.

Figure 2:
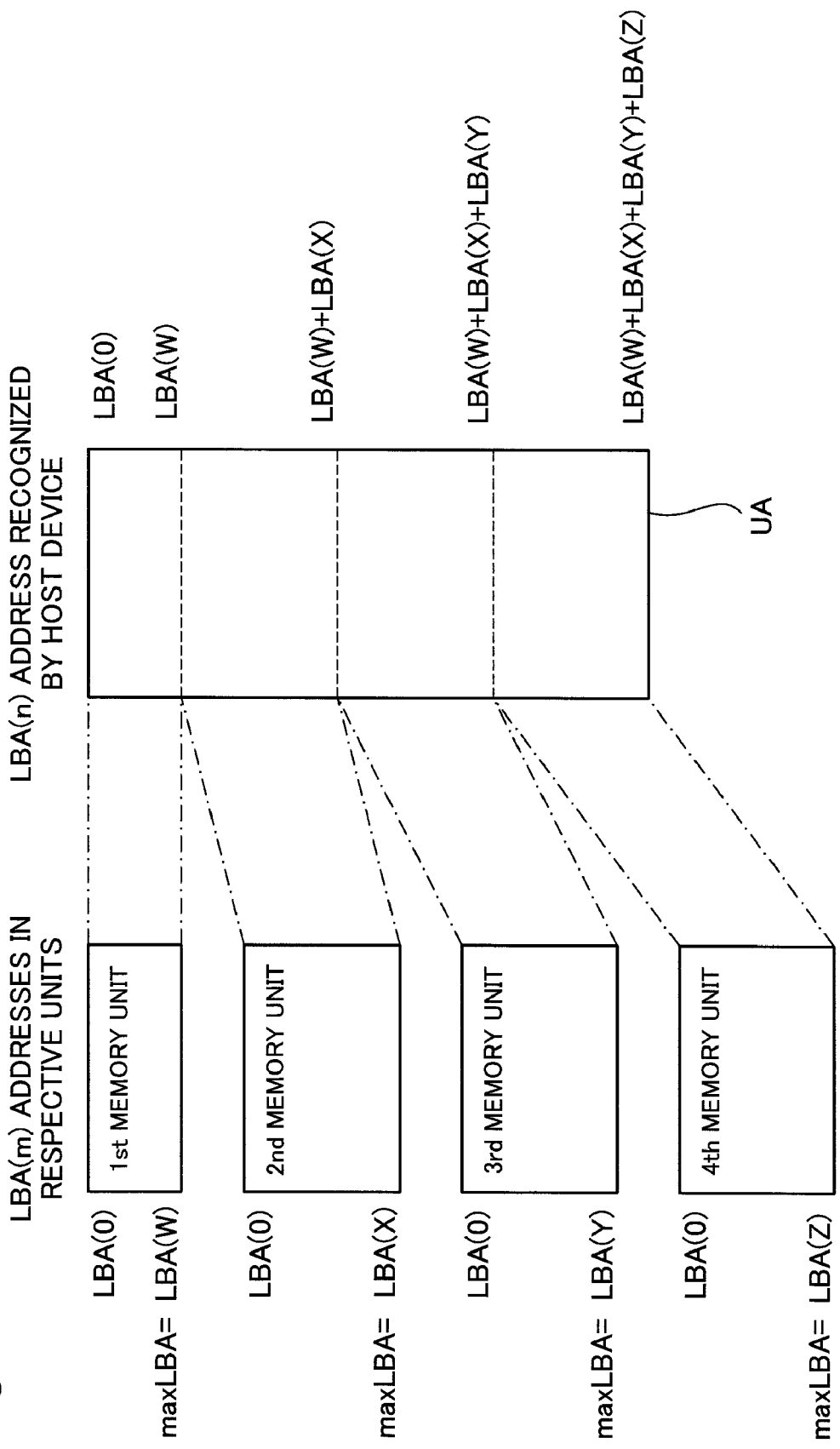
FIG. 2 is a conceptual view showing address conversion performed by a unit management circuit in the storage device of the first embodiment.

FIG. 2 is a conceptual view showing the process of address conversion performed by the unit management circuit 22. The left half of FIG. 2 shows the storage areas of the respective memory units 30 to 60 under management of the unit management circuit 22. In the illustrated example, the storage area in the first memory unit 30 is defined by LBA addresses of '0' to 'W'. Similarly the storage area in the second memory unit 40, the storage area in the third memory unit 50, and the storage area in the fourth memory unit 60 are respectively defined by LBA addresses of '0' to 'X', by LBA addresses of '0' to 'Y', and by LBA addresses of '0' to 'Z'.

The right half of FIG. 2 shows a single storage area obtained by combining the storage areas of the respective memory units 30 to 60. As illustrated, the unit management circuit 22 arranges the storage area of the binary memory 31 in the first memory unit 30 as a head area and sequentially locates the storage areas of the multivalued memories 41 to 61 in the other memory units 40 to 60 behind the binary memory 31. The combined single storage area is defined by LBA addresses of '0' to 'W+X+Y+Z' as shown in FIG. 2. Combining the storage areas in this manner by the unit management circuit 22 enables the host device 80 to recognize the combined single storage area defined by the sequential LBA addresses of '0' to 'W+X+Y+Z' as a storage area of the storage device 10. In the explanation below, the combined single storage area is simply referred to as 'combined area UA'.

Figure 3:
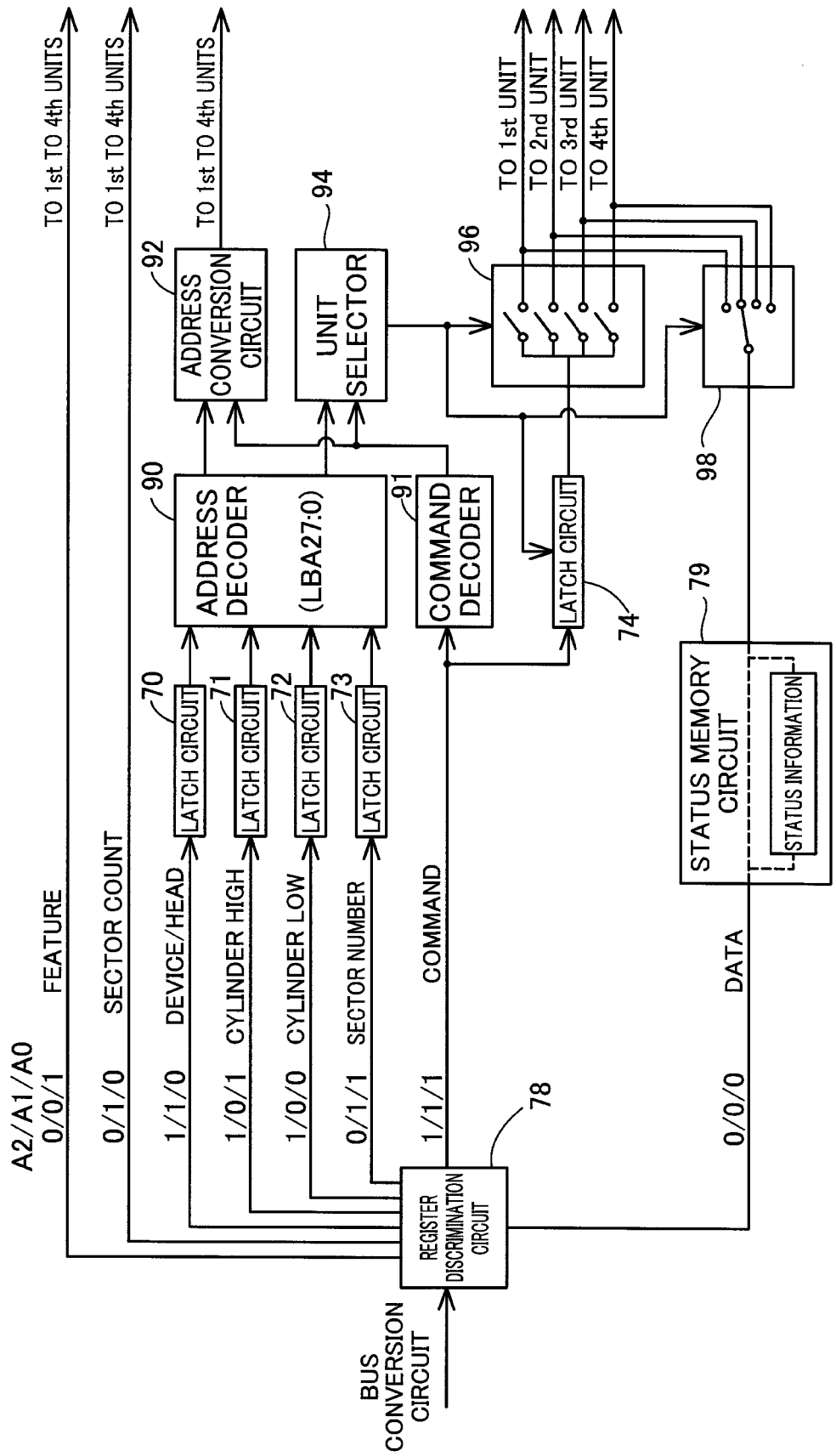
FIG. 3 is a block diagram schematically showing the internal structure of the unit management circuit in the first embodiment.

FIG. 3 is a block diagram schematically showing the internal structure of the unit management circuit 22. The unit management circuit 22 functions to transfer ATA commands and data output from the host device 80 to the respective memory units 30 to 60, in addition to the address conversion explained above. The internal structure shown in FIG. 3 is involved in this transfer function.

Each of the unit controllers 32 to 62 included in the respective memory units 30 to 60 has eight registers in conformity with the ATA standard as command block registers. The eight registers are (1) a feature register, (2) a sector count register, (3) a device/head register, (4) a cylinder high register, (5) a cylinder low register, (6) a sector number register (7), a command register, and (8) a data register. Each of the unit controllers 32 to 62 controls data reading and writing from and into the binary memory 31 or the multivalued memory 41, 51, or 61 based on the settings of various parameters in these registers. The host device 80 sends access signals for these registers to the storage device 10 in the data reading and writing process.

The unit management circuit 22 receives an access signal via the USB interface and the bus conversion circuit 21 from the host device 80 and changes the transfer method of the received access signal to the respective memory units 30 to 60 according to the type of the register identified as an access target. The unit control circuit 22 includes a register discrimination circuit 78 configured to identify the type of the register as the access target.

The register discrimination circuit 78 refers to the settings of the address signals A0 to A2 in conformity with the ATA standard input from the bus conversion circuit 21 and identifies the type of the register as the access target. For example, the register discrimination circuit 78 identifies the feature register as the access target of the received access signal, based on the settings of the address signal A2, the address signal A1, and the address signal A0 respectively equal to '0', '0', and '1'.

In the case of reception of an access signal for the feature register or an access signal for the sector counter register from the host device 80, the unit management circuit 22 causes the received access signal to simply pass therethrough and to be transferred to all the memory units 30 to 60. This is because the feature register and the sector counter register are not used to directly specify a position in the combined area UA. The feature register is used to specify various parameters in response to respective ATA commands, whereas the sector counter register is used to specify the number of multiple sectors as targets for sequential accesses. In the case of sequential accesses, the device/head register, the cylinder high register, the cylinder low register, and the sector number register are used to specify a 'head sector' as explained later.

The device/head register, the cylinder high register, the cylinder low register, and the sector number register are used to specify a position (sector) in the combined area UA. Parts of an LBA address defining a sector in the combined area UA are separately entered into these registers. For example, when an LBA address is a parameter of 28-bit length, a bit sequence of a 0th bit position to a 7th bit position, a bit sequence of an 8th bit position to a 15th bit position, a bit sequence of a 16th bit position to a 23rd bit position, and a bit sequence of a 24th bit position to a 27th bit position are entered respectively into the sector number register, into the cylinder low register, into the cylinder high register, and into the device/head register. In response to reception of an access signal for these registers as an LBA address, the unit management circuit 22 latches and stores respective parts of the received access signal or LBA address by latch circuits 70 to 73 provided therein.

The respective parts of the access signal or LBA address latched and stored by the latch circuits 70 to 73 are entered into an address decoder 90. The address decoder 90 functions to combine the respective parts of the access signal or LBA address discretely stored in these latch circuits 70 to 73 and restore an LBA address of the 28-bit length. The address decoder 90 also functions to compare the restored LBA address with the maximum number of sectors in each of the memory units 30 to 60. This function will be described later in detail.

The command register is used to specify various commands in conformity with the ATA standard. Typical examples of these commands include a read sector command to read data from a specified sector and a write sector command to write down data into a specified sector. The unit management circuit 22 inputs a received command signal for the command register into a command decoder 91 and a latch circuit 74.

The command decoder 91 identifies the type of the input command signal and outputs the result of identification to an address conversion circuit 92 and a unit selector 94. The command signal entered into the latch circuit 74 is kept in the latch circuit 74 until an output instruction is given by the unit selector 94.

The address conversion circuit 92 functions to convert an LBA address of the combined area UA input from the address decoder 90 into an LBA address for the respective memory units 30 to 60 as shown in FIG. 2. According to a concrete procedure, the address conversion circuit 92 inputs an LBA address from the address decoder 90 and the identified command type from the command decoder 91 and identifies whether the input command type is a command requiring LBA address. The command requiring LBA address is generally a command for specifying an address (sector) and making some access to the specified address. Typical examples of the command requiring LBA address include 'read sector command', 'write sector command', 'read multiple command' 'write multiple command', 'read DMA command', 'write DMA command', 'read verify sector command', and 'seek command'. Upon identification that the input command type is a command requiring LBA address, the address conversion circuit 92 converts an LBA address input from the address decoder 90 into an LBA address for the respective memory units 30 to 60 and transfers the converted LBA address to all the memory units 30 to 60. The details of such address conversion will be described later. As mentioned below, the main controller 20 does not simultaneously transfer an ATA command requiring LBA address to multiple memory units, so that the converted LBA address is transferable to all the memory units 30 to 60. This arrangement desirably saves the labor of the address conversion circuit 92 to select a transfer destination. The converted LBA address may alternatively be transferred to only a relevant memory unit selected as a transfer destination.

Upon identification that the input command type from the command decoder 91 is a command not requiring LBA address, the address conversion circuit 92 transfers parameters input from the address decoder 90 to all the memory units 30 to 60 without address conversion. In the case of the command not requiring LBA address, the access signal to be enter into the device/head register and the other relevant registers does not necessarily represent an LBA address. The command not requiring LBA address is generally a command for performing some operation on the flash memory without specification of an address (sector). Typical examples of the command not requiring LBA address include 'identify device command', 'set feature command', 'check power mode command', 'sleep command', 'standby command', and 'idle command'. In one modification, even in the case where the input command type from the command decoder 91 is identified as a command not requiring LBA address, the address conversion circuit 92 may transfer a converted LBA address to the respective memory units 30 to 60 as in the case of the command requiring LBA address. This is because the command not requiring LBA address is executed, irrespective of the presence or the absence of an LBA address. In another modification, the address conversion circuit 92 may convert an LBA address without transferring the converted LBA address.

The unit selector 94 is a circuit to select at least one memory unit as a transfer destination of an input command, based on an LBA address input from the address decoder 90. According to a concrete procedure, the unit selector 94 inputs an LBA address from the address decoder 90 and an identified command type from the command decoder 91 and identifies whether or not the input command type is a command requiring LBA address. Upon identification that the input command type is a command requiring LBA address, the unit selector 94 selects one memory unit as the transfer destination of the input command among the memory units 30 to 60, based on the input LBA address. The details of such selection of a memory unit will be described later. After selection of the memory unit as the transfer destination of the input command, the unit selector 94 controls a first switch circuit 96 to connect the latch circuit 74 with the selected memory unit as the transfer destination of the input command. The command signal latched by and kept in the latch signal 74 is then transferred to the selected memory unit.

The transfer timing of the command signal latched by and kept in the latch circuit 74 to the selected memory unit is set to a timing after transmission of a converted LBA address from the address conversion circuit 92 to the respective memory units 30 to 60 and switching control of the first switch circuit 96 by means of the unit selector 94. This is because the ATA standard requests settings of an LBA address in registers prior to transmission of a command requiring LBA address. Upon identification that the input command type is a command not requiring LBA address, on the other hand, the unit selector 94 controls the first switch circuit 96 to connect the latch circuit 74 with all the memory units 30 to 60. This arrangement enables the same command not requiring LBA address to be transferred to all the memory units 30 to 60. In one modification, when the input command type is identified as a command not requiring LBA address, the latch circuit 74 may be designed not to latch or delay the transfer of the command signal.

The unit selector 94 similarly controls a second switch circuit 98 after controlling the first switch circuit 96 based on the input LBA address. The second switch circuit 98 is used to switch over the transfer destination of an access signal for the data register. In response to switching control of the second switch circuit 98 by means of the unit selector 94, a data signal is transferred to the same memory unit as the memory unit selected as the transfer destination of the command requiring LBA address.

A status memory circuit 79 is located between the second switch circuit 98 and the register discrimination circuit 78. The status memory circuit 79 stores the total capacity of the combined area UA (the total number of sectors) and a device ID representing manufacturer information of the storage device 10. In response to a request for transmission of status information from the host device 80, the memory unit selected by the second switch circuit 98 generally sends back the requested status information to the host device 80. In response to an inquiry for the total number of sectors in the storage device 10 or an inquiry for the device ID by output of, for example, an 'identify device' command, on the other hand, the status memory circuit 79 sends back the inquired status information to the host device 80. The structure of allowing reply of status information from the status memory circuit 79 ensures accurate transmission of specific status information, which is related to the whole storage device 10 and is not sufficiently responded by each memory unit, to the host device 80.

Figure 4:
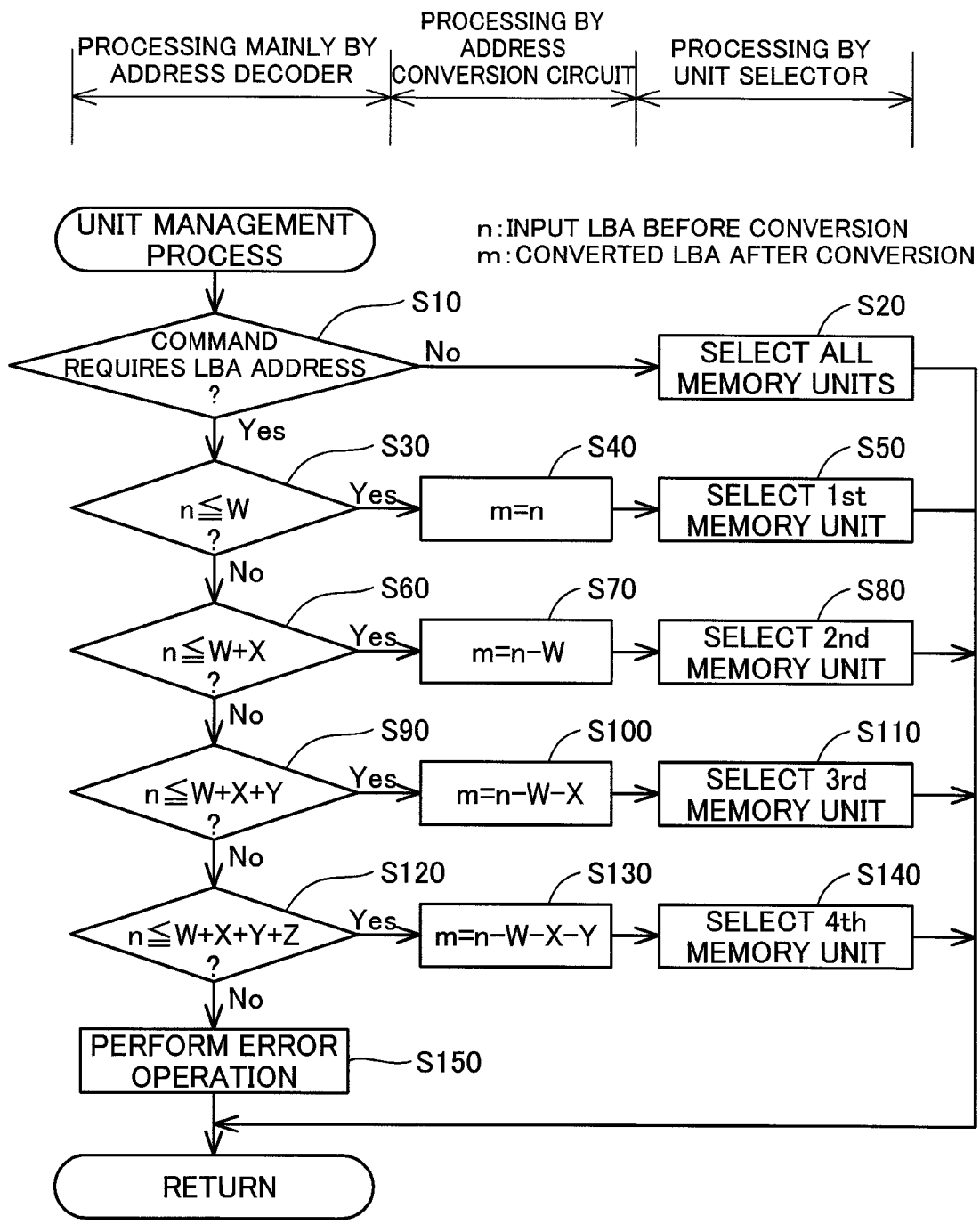
FIG. 4 is a flowchart showing a unit management process executed in the first embodiment.

FIG. 4 is a flowchart showing an address conversion process executed by the address decoder 90 and the address conversion circuit 92 with a memory unit selection process executed by the unit selector 94. In the description hereafter, these series of processing are simply referred to as 'unit management process' for the convenience of explanation.

The address conversion circuit 92 first identifies whether the input command type from the command decoder 91 is a command requiring LBA address (step S10). Upon identification of the command not requiring LBA address (step S10: No), the address conversion circuit 92 does not perform address conversion but directly transfers its input parameters to all the memory units 30 to 60 to be entered into their device/head registers and the other relevant registers. In response to such direct transfer of the input parameters, the unit selector 94 selects all the memory units 30 to 60 as the transfer destinations of the command (step S20). The unit management process is terminated after the unit selection. In this case, an identical command is transferred to all the memory units 30 to 60. As mentioned previously, even in the case of identification of the command not requiring LBA address, the address conversion circuit 92 may perform address conversion described below, as in the case of identification of the command requiring LBA address.

Upon identification of the command requiring LBA address (step S10: Yes), on the other hand, the address decoder 90 determines whether an input LBA address n is less than or equal to the maximum value W of the LBA address (see FIG. 2) in the first memory unit 30 (step S30). When the input LBA address n is less than or equal to the maximum value W (step S30: Yes), the address conversion circuit 92 does not perform address conversion but directly sets the input LBA address n from the address decoder 90 to a converted LBA address m (step S40). In this case, the unit selector 94 selects the first memory unit 30 as the transfer destination of the command (step S50).

When the input LBA address n is greater than the maximum value W of the LBA address in the first memory unit 30 (step S30: No), the address decoder 90 subsequently determines whether the input LBA address n is less than or equal to the sum (W+X) of the maximum value W of the LBA address in the first memory unit 30 and the maximum value X of the LBA address in the second memory unit 40 (step S60). When the input LBA address n is less than or equal to the sum (W+X) (step S60: Yes), the address conversion circuit 92 sets the result of subtraction of the maximum value W of the LBA address in the first memory unit 30 from the input LBA address n to the converted LBA address m (step S70). In this case, the unit selector 94 selects the second memory unit 40 as the transfer destination of the command (step S80).

When the input LBA address n is greater than the sum (W+X) (step S60: No), the address decoder 90 subsequently determines whether the input LBA address n is less than or equal to the sum (W+X+Y) of the maximum value W of the LBA address in the first memory unit 30, the maximum value X of the LBA address in the second memory unit 40, and the maximum value Y of the LBA address in the third memory unit 50 (step S90). When the input LBA address n is less than or equal to the sum (W+X+Y) (step S90: Yes), the address conversion circuit 92 sets the result of subtraction of the maximum value W of the LBA address in the first memory unit 30 and the maximum value X of the LBA address in the second memory unit 40 from the input LBA address n to the converted LBA address m (step S100). In this case, the unit selector 94 selects the third memory unit 50 as the transfer destination of the command (step S110).

When the input LBA address n is greater than the sum (W+X+Y) (step S90: No), the address decoder 90 subsequently determines whether the input LBA address n is less than or equal to the sum (W+X+Y+Z) of the maximum value W of the LBA address in the first memory unit 30, the maximum value X of the LBA address in the second memory unit 40, the maximum value Y of the LBA address in the third memory unit 50, and the maximum value Z of the LBA address in the fourth memory unit 60 (step S120). When the input LBA address n is less than or equal to the sum (W+X+Y+Z) (step S120: Yes), the address conversion circuit 92 sets the result of subtraction of the maximum value W of the LBA address in the first memory unit 30, the maximum value X of the LBA address in the second memory unit 40, and the maximum value Y of the LBA address in the third memory unit 50 from the input LBA address n to the converted LBA address m (step S130). In this case, the unit selector 94 selects the fourth memory unit 60 as the transfer destination of the command (step S140).

The input LBA address n of greater than the sum (W+X+Y+Z) (step S120: No) indicates specification of the LBA address out of the combined area UA. In this case, a predetermined error operation is performed (step S150). The predetermined error operation, for example, discards the currently input command. The above series of unit management process only requires relatively simple comparisons to attain address conversion and selection of at least one memory unit as the transfer destination of the input command.

As described above, the storage device 10 of the embodiment performs address conversion to locate the binary memory 31 as the SLC flash memory in the head of the combined area UA. On formatting of the memory device 10 according to a file system, such as FAT16 or FAT32, a file allocation table (hereafter referred to as FAT information) is created in the binary memory 31. The FAT information is data management information frequently rewritten in response to data writing or data deleting. The SLC flash memory (binary memory 31) having the higher data writing speed than the MLC flash memories (multivalued memories 41 to 61) is located in a head area where such data management information is written. The configuration of the storage device 10 of the embodiment adopts the multiple MLC flash memories to satisfy the high capacity requirement, while arranging the SLC flash memory in the head of the storage area to significantly enhance the data writing speed compared with a storage device including only MLC flash memories. While the MLC flash memory requires 600 nsec as a writing time of FAT information, the SLC flash memory requires only about 200 nsec as the writing time of the FAT information.

Here gives an example of data writing speed. As is known in the art, the FAT16 or FAT32 file system writes two identical sets of FAT information as part of management information. The storage device including only MLC flash memories requires 600 nsec for rewriting a first set of FAT information, another 600 nsec for rewriting a second set of FAT information, and another 600 nsec for data rewriting. The total data rewriting time of this storage device is 1800 nsec. The storage device 10 of the embodiment including the SLC flash memory located in the FAT information writing area, on the other hand, requires 200 nsec for rewriting the first set of FAT information, another 200 nsec for rewriting the second set of FAT information, and 600 nsec for data rewriting (into the multivalued memory). The total data rewriting time of the storage device 10 of the embodiment is 1000 nsec. The configuration of the storage device 10 of the embodiment thus desirably saves approximately 45% of the data rewriting time, compared with the storage device including only MLC flash memories.

The SLC flash memory generally has 10- through 20-fold higher rewritable capability than the MLC flash memory. The arrangement of the SLC flash memory in the management information writing area where the FAT information is frequently rewritten significantly improves the reliability of data storage. The storage device 10 is thus readily usable not only as an external storage device but as a boot drive of the operating system like the conventional hard disk drive.

The storage device 10 of the embodiment adopts the compact flash controllers as the unit controllers 32 to 62 for controlling the binary memory 31 and the multivalued memories 41 to 61. Compact flashes have high general versatility and enable control of flash memories of diverse characteristics. In the storage device 10 of the embodiment, the compact flash controller is provided for each of the memory units 30 to 60. Even when the memory units 30 to 60 use the flash memories 31 to 61 of different manufacturers, the compact flash controllers 32 to 62 absorb the differences in characteristics between the flash memories 31 to 61 and ensure normal operations of these flash memories 31 to 61. The use of the compact flash controllers thus facilitates the construction of the storage device including both the binary memory and the multivalued memory. The compact flash controllers are adopted for the respective unit controllers in the storage device 10 of the embodiment, but may be replaced with SD memory controllers or multimedia card controllers according to the requirements.

In the storage device 10 of the embodiment, the functions of the main controller 20 for address conversion and unit management are actualized by the hardware configuration. One modification may construct the main controller 20 as a microcomputer including a CPU, a ROM, and a RAM to attain the functions of address conversion and unit management by the software configuration. Another modification may adopt an RAID chip as the main controller 20 and activate the RAID chip to perform spanning operations and thereby control the respective memory units 30 to 60.

The storage device 10 of the embodiment has the four memory units 30 to 60. The number of memory units included in the storage device is, however, not restricted to four but may be determined arbitrarily according to the requirements. The minimum requirement for the configuration of the storage device is one memory unit including a binary memory and one memory unit including a multivalued memory.

In the storage device 10 of the embodiment, the binary memory 31 has the storage capacity of 1 gigabyte. The storage capacity of the binary memory 31 may be determined according to the following procedure. In this explanatory example, it is assumed that the storage device 10 is formatted according to the FAT32 file system and that the total storage capacity of the storage device 10 is x gigabytes. In the FAT file system, each sector generally has a capacity of 4 kilobytes. There are accordingly a total of (x/4) mega sectors. The FAT32 file system requires a data volume of 4 bytes for expressing one address. One set of FAT information thus requires a data volume of x megabytes (=4 bytes×(x/4) mega sectors). As mentioned above, the FAT32 file system generally writes two identical sets of FAT information and accordingly requires a management area having the capacity of (2×x) megabytes. The management information is not only the FAT information but includes other pieces of information, such as master boot records and directory entries. A total capacity required for the management area is thus greater than (2×x) megabytes. In a concrete example, when the total storage capacity of the storage device 10 is 128 gigabytes, the storage capacity required for the FAT information is 256 megabytes. A binary memory having a storage capacity of approximately 500 megabytes is required to satisfy the capacity for the management area including the master boot records and the directory entries as well as the FAT information. The required storage capacity for the binary memory 31 is accordingly at least 0.5% of the whole storage area (combined area UA) in the storage device 10. The binary memory 31 having a storage capacity of approximately 1% of the combined area UA is desirable for storing the management information with some margin. The binary memory has the higher operation speed and the higher reliability than the multivalued memory and may have a storage capacity of greater than 1% of the combined area UA.

B. Second Embodiment

Figure 5:
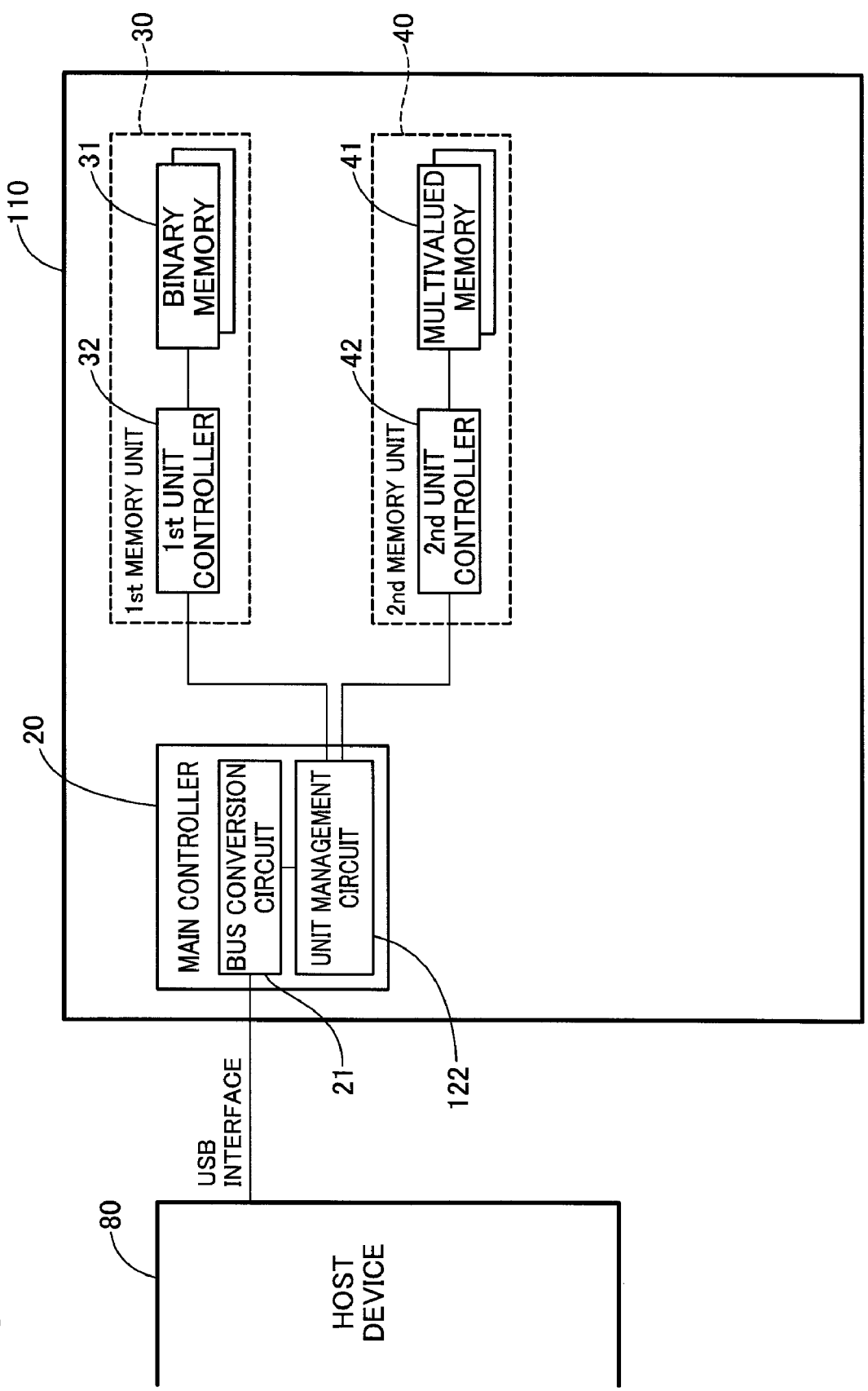
FIG. 5 schematically illustrates the configuration of a storage device in a second embodiment of the invention.

FIG. 5 schematically illustrates the configuration of a storage device 110 in a second embodiment of the invention. As illustrated, the storage device 110 of this embodiment includes a main controller 20, a first memory unit 30 having a binary memory 31, and a second memory unit 40 having a multivalued memory 41. The main controller 20 has a bus conversion circuit 21 and a unit management circuit 122, as in the main controller 20 of the first embodiment. In the main controller 20 of the second embodiment, the unit management circuit 122 switches over the target of data reading and data writing between the first memory unit 30 and the second memory unit 40, based on an LBA address, data, and a command specified by the host device 80.

Figure 6:
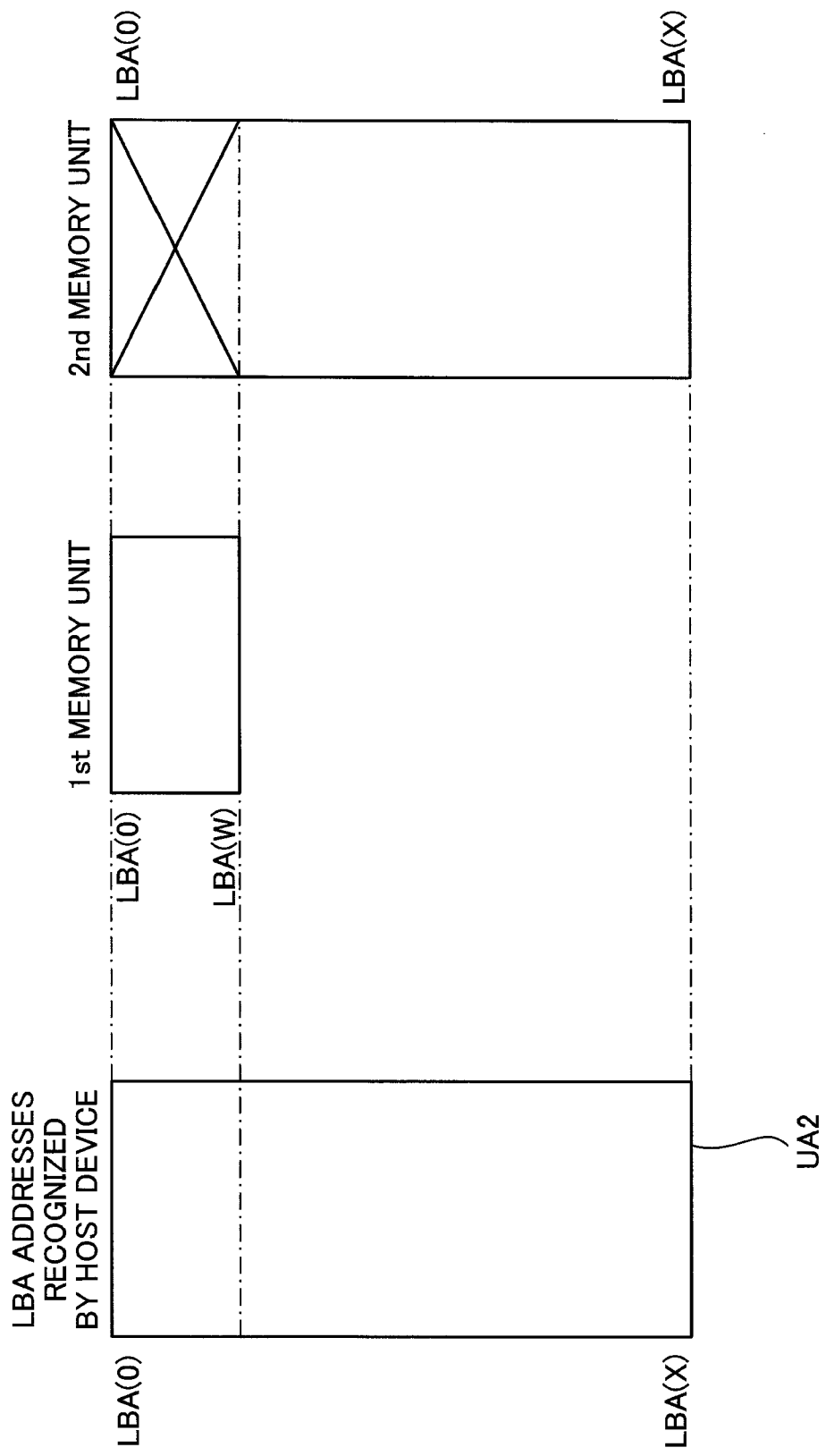
FIG. 6 is a conceptual view showing switchover control between memory units performed by a unit management circuit in the storage device of the second embodiment.

FIG. 6 is a conceptual view showing switchover control between the memory units 30 and 40 by the unit management circuit 122. The left-side, the middle, and the right-side drawings of FIG. 6 respectively show a whole storage area UA2 of the storage device 110 recognized by the host device 80, a storage area provided in the first memory unit 30, and a storage area provided in the second memory unit 40.

In the storage device 110 of the second embodiment, the storage area in the first memory unit 30 is defined by LBA addresses of '0' to 'W', and the storage area in the second memory unit 40 is defined by LBA addresses of '0' to 'X'. The LBA address 'X' is a larger value than the LBA address 'W'.

In response to specification of an LBA address in the range of '0' to 'W' by the host device 80, the unit management circuit 122 switches over the target of data reading and data writing to the first memory unit 30 with the binary memory 31. In response to specification of an LBA address of larger than the value 'W' by the host device 80, on the other hand, the unit management circuit 122 switches over the target of data reading and data writing to the second memory unit 40 with the multivalued memory 41. Namely the unit management circuit 122 compares the LBA address specified by the host device 80 with the threshold value 'W' and switches over the effective memory unit as the target of data reading and data writing based on the result of the comparison. Such switchover control causes an unused storage area (defined by LBA addresses of '0' to 'W') to be left in the second memory unit 40.

FIG. 7 is a block diagram schematically showing the internal structure of the unit management circuit 122. As illustrated, the unit management circuit 122 of the second embodiment includes a register discrimination circuit 178, a switchover control circuit 194, a first switch circuit 196, and a second switch circuit 198.

The register discrimination circuit 178 is connected with the bus conversion circuit 21 shown in FIG. 5. The register discrimination circuit 178 refers to the settings of address signals A0 to A2 in conformity with the ATA standard input from the bus conversion circuit 21 and identifies the type of a register as an access target, as in the register discrimination circuit 78 of the first embodiment. After identification of the register, the register discrimination circuit 178 transfers an access signal received from the bus conversion circuit 21 to the switchover control circuit 194.

The switchover control circuit 194 performs switchover control to switch over the effective memory unit as the target of data reading and data writing between the first memory unit 30 and the second memory unit 40, based on the type of the register as the access target identified by the register discrimination circuit 178 and an LBA address, data, and a command specified by the host device 80.

In response to an instruction from the switchover control circuit 194, the first switch circuit 196 opens and closes the connection between the bus conversion circuit 21 and the first memory unit 30.

In response to an instruction from the switchover control circuit 194, the second switch circuit 198 opens and closes the connection between the bus conversion circuit 21 and the second memory unit 40.

As illustrated in FIG. 7, the switchover control circuit 194 includes an address decoder 190, an address comparator circuit 192, a size register 179, and a command decoder 191.

In response to reception of an access signal for the device/head register, the cylinder high register, the cylinder low register, and the sector number register, the address decoder 190 analyzes the LBA address specified by the host device 80. The command decoder 191 analyzes the command specified by the host device 80.

The size register 179 stores a threshold value determined corresponding to the maximum storage capacity of the first memory unit 30. In the storage device 110 of the second embodiment, the first memory unit 30 has the maximum storage capacity of 512 megabytes, and the threshold value stored in the size register 179 is an LBA address representing a storage capacity of 480 megabytes, which is smaller than the maximum storage capacity of 512 megabytes. This is because the flash memory may have a missing block or a bad block and may be incapable of using the maximum storage capacity of 512 megabytes. The threshold value may alternatively be an LBA address representing the maximum storage capacity of the first memory unit 30. The storage capacity of 480 megabytes is expressed as '00000000111100000000000000000' in binary notation by the LBA technique. When the threshold value is set to the LBA address representing the storage capacity of 480 megabytes, it is determined whether the value of upper 8 bits in an LBA address of 28-bit length specified by the host device 80 is equal to or larger than '00000000'. Such determination is equivalent to the comparison between the specified LBA address and the threshold value (480 megabytes). This setting of the threshold value enables the address comparator circuit 192 to readily determine whether the specified LBA address exceeds the threshold value by using only the 4-bit device-head register and the upper 4 bits of the 8-bit cylinder high register without referring to the values of the cylinder low register and the sector number register.

The address comparator circuit 192 compares the LBA address analyzed by the address decoder 190 with the threshold value stored in the size register 179 and switches over the effective memory unit as the access target between the first memory unit 30 and the second memory unit 40 as shown in FIG. 6.

FIG. 8 shows the details of the switchover control performed by the switchover control circuit 194. A 'switchover' operation in FIG. 8 represents an access to the memory unit selected by the address comparator circuit 192. A 'simultaneous access' operation represents identical accesses to the first memory unit 30 and the second memory unit 40, irrespective of the selection by the address comparator circuit 192.

The 'write time' in FIG. 8 shows the situation of outputting a write command from the host device 80. The write command may be, for example, a write instruction of a command for the command register, a write instruction of data for the data register, or a write instruction of an LBA address or diversity of other parameters for the other registers. The 'read time' shows the situation of outputting a read command from the host device. The read command may be, for example, a read instruction of various statuses and data from the memory unit.

As shown in FIG. 8, accesses for the data register and the command register are, in principle, made to the memory unit selected by the address comparator circuit 192 in both the write time and the read time. Accesses for the other registers are, on the other hand, made to the memory unit selected by the address comparator circuit 192 in only the read time, while being identical accesses made to the two memory units 30 and 40 in the write time. The registers other than the data register and the command register are mainly used to specify an address. As long as data or a command as a writing object is adequately transferred to the selected memory unit, there is no problem caused by writing an identical address into the corresponding registers in the first memory unit 30 and the second memory unit 40 in the write time.

In the case of 'exception 1' shown in FIG. 8, the command analysis performed by the command decoder 191 identifies the command transferred by the host device 80 as a command for changing over the operating status of the whole memory unit, for example, an idle command or a standby command. In this case, the switchover control circuit 194 exceptionally transfers the command to both the first memory unit 30 and the second memory unit 40.

In the case of 'exception 2' shown in FIG. 8, the storage capacity (the total number of sectors) of the storage device 110 is read in response to, for example, an identify device command. In this case, the switchover control circuit 194 exceptionally makes an access to the second memory unit 40. This is because the total storage capacity of the storage device 110 of the second embodiment is identical with the storage capacity of the second memory unit 40 as shown in FIG. 6.

As described above, the storage device 110 of the second embodiment locates the SLC flash memory in the head of the storage area and the MLC flash memory in the residual storage area. The frequently rewritten FAT information is thus storable in the SLC flash memory having the higher rewritable capability and the higher processing speed. Like the storage device 10 of the first embodiment, the configuration of the storage device 110 of the second embodiment adopts the MLC flash memory to satisfy the high capacity requirement, while arranging the SLC flash memory in the head of the storage area to significantly improve the data writing speed and the reliability of data storage compared with the storage device including only MLC flash memories.

The storage device 110 of the second embodiment enables data reading and data writing from and into two memory units by directly using the address specified by the host device 80. This arrangement does not require a circuit structure for rather complicated address conversion and scales down the circuit size of the main controller 20, thus reducing the total manufacturing cost of the storage device 110.

The embodiments discussed above are to be considered in all aspects as illustrative and not restrictive. There may be many modifications, changes, aspects and alterations without departing from the scope or spirit of the main characteristics of the present invention. For example, in the above embodiments, the USB interface is used for connection of the storage device with the host device. The interface used for such connection is, however, not restricted to the USB interface but may be any of various interfaces, such as an IEEE 1394 interface, a serial ATA interface, or a parallel ATA interface.

C. Other Aspects of the Invention

In one preferable application of the storage device according to the above aspect of the invention, the controller includes: an address converter configured to perform address conversion from the first storage area and the second storage area to the combined storage area and from the combined storage area to the first storage area and the second storage area; and a selector configured to select a destination of data reading and data writing between the binary flash memory and the multivalued flash memory according to a result of the address conversion. The destination of data reading and data writing is readily determined according to the result of the address conversion.

In one preferable embodiment of the storage device of this application, the controller sends a command for data reading and data writing to the flash memory selected by the selector after transmission of an address converted by the address converter to the binary flash memory and the multivalued flash memory.

The storage device of this embodiment sends the converted address to all the flash memories and subsequently sends the command to only the selected flash memory. This arrangement does not require selection of the transmission destination of the converted address between the binary flash memory and the multivalued flash memory, thus enhancing the processing speed.

In the storage device according to the above aspect of the invention, the first storage area may occupy a fraction of not less than 0.5% but less than 100% of the combined storage area. Setting the first storage area in this range enables the management information, such as the file allocation table, to be reliably stored in the binary flash memory.

In one preferable application, the storage device is connected to a host device via a predetermined interface. The controller performs data reading and data writing in response to an instruction given by the host device. This configuration enables the storage device to be used as an external storage device or an internal storage device of the host device. The predetermined interface may be any of various interfaces, for example, USB, IEEE 1394, parallel ATA, or serial ATA.

In the storage device of this application, in response to an inquiry for a storage capacity of the storage device from the host device, the controller may be arranged to send back a storage capacity of the combined storage area to the host device. The storage device of this arrangement notifies the host device of not the individual storage capacities of the respective flash memories but the total storage capacity of the combined storage area.

In one preferable embodiment according to the above aspect of the invention, the storage device includes plural multivalued flash memories. The controller arranges the first storage area in a head area and logically combines the first storage area with plural second storage areas to form the combined storage area. The storage device including the plural multivalued flash memories has a high capacity storage area. According to another aspect, the invention pertains to a storage device constructed to store data according to a predetermined file system for recording data management information in a head of a storage area. The storage device includes: a binary flash memory that has a first storage area and a capacity of storing two values per cell; a multivalued flash memory that has a greater second storage area than the first storage area and a capacity of storing at least three values per cell; a comparator configured to compare an address specified by a host device connected to the storage device with a threshold value determined corresponding to a maximum storage capacity of the first storage area; and a controller configured to, when the specified address does not exceed the threshold value, switch over a destination of data reading and data writing to the binary flash memory and when the specified address exceeds the threshold value, switch over the destination of data reading and data writing to the multivalued flash memory.

The storage device according to this aspect of the invention enables data reading and data writing from and into the multivalued flash memory and the binary flash memory having different characteristics by simple switchover of the destination of data reading and data writing between the binary flash memory and the multivalued flash memory based on the specified address. The storage device of this arrangement adopts the multivalued flash memory to satisfy the high capacity requirement, while adopting the binary flash memory to satisfy the requirements of high speed processing and high reliability.

In one preferable application of the storage device according to this aspect of the invention, the controller performs data reading and data writing from and into the binary flash memory or the multivalued flash memory by directly using the specified address, regardless of the switchover of the destination of data reading and data writing to the binary flash memory or to the multivalued flash memory. This arrangement does not require address conversion from the address specified by the host device to an address in another system, thus desirably simplifying the processing.

In the storage device of this application, in response to an inquiry for a storage capacity of the storage device from the host device, the controller may be arranged to send back a storage capacity of the second storage area. The maximum storage capacity of the storage device is identical with the storage capacity of the second storage area. The storage device of this arrangement notifies the host device of the storage capacity of the storage device by simply sending back the storage capacity of the second storage area.

What is claimed is:

1. A storage device that stores data according to a predetermined file system for recording data management information in a head of a storage area, the storage device comprising:
   a binary flash memory that has a first storage area and a capacity of storing two values per cell;
   a multivalued flash memory that has a second storage area greater than the first storage area and a capacity of storing at least three values per cell;
   a comparator configured to compare an address specified by a host device connected to the storage device with a threshold value determined corresponding to a maximum storage capacity of the first storage area; and
   a controller configured to, when the specified address does not exceed the threshold value, switch over a destination of data reading and data writing to the binary flash memory and when the specified address exceeds the threshold value, switch over the destination of data reading and data writing to the multivalued flash memory;
   wherein the controller performs data reading and data writing from and into the binary flash memory or the multivalued flash memory by directly using the specified address, regardless of the switchover of the destination of data reading and data writing to the binary flash memory or to the multivalued flash memory, so that the controller does not use a storage area corresponding to an address smaller than the threshold value and use a storage area corresponding to an address exceeding the threshold value, within the second storage area of the multivalued flash memory;
   wherein in response to an inquiry for a storage capacity of the storage device from the host device, the controller sends back a storage capacity of the second storage area.

* * * * *